United States Patent [19]
Cliff et al.

[11] Patent Number: 5,481,486
[45] Date of Patent: Jan. 2, 1996

[54] LOOK UP TABLE IMPLEMENTAION OF FAST CARRY ARITHMETIC AND EXCLUSIVE-OR OPERATIONS

[75] Inventors: Richard G. Cliff, Milpitas; L. Todd Cope, San Jose, both of Calif.

[73] Assignee: Altera Corporation, San Jose, Calif.

[21] Appl. No.: 166,300

[22] Filed: Dec. 13, 1993

Related U.S. Application Data

[63] Continuation-in-part of Ser. No. 880,752, May 8, 1992, Pat. No. 5,274,581.

[51] Int. Cl.$^6$ ..................................................... G06F 7/50
[52] U.S. Cl. ........................................... 364/716; 364/786
[58] Field of Search .................................. 364/716, 786; 307/465; 326/38

[56] References Cited

U.S. PATENT DOCUMENTS

| | | | |
|---|---|---|---|
| 4,124,899 | 11/1978 | Birkner et al. | 364/716 |
| 4,623,982 | 11/1986 | Ware | 364/788 |
| 4,642,487 | 2/1987 | Carter | 307/465 |
| 4,706,216 | 11/1987 | Carter | 365/94 |
| 4,742,520 | 5/1988 | Hoac et al. | 364/716 |
| 4,758,985 | 7/1988 | Carter | 365/94 |
| 4,815,022 | 3/1989 | Glaeser et al. | 364/716 |
| 4.870,302 | 9/1989 | Freeman | 307/465 |
| 5,053,647 | 10/1991 | Shizukuishi et al. | 307/465 |
| 5,059,828 | 10/1991 | Tanagawa | 307/465 |

FOREIGN PATENT DOCUMENTS 456475 11/1991 European Pat. Off. .

OTHER PUBLICATIONS

E. J. McCluskey, "Iterative Combinational Switching Networks—General Design Considerations", IRE Transactions on Electronic Computers, Dec. 1958, pp. 285–291.

R. C. Minnick, "A Survey of Microcellular Research", Jounral of the Association for Computing Machinery, vol. 14, No. 2, pp. 203–241, Apr. 1967.

*Recent Developments in Switching Theory*, A. Mukhopadhyay, ed., Academic Press, New York, 1971, chapters VI and IX, pp. 229–254 and 369–422.

H. Fleisher, "An Introduction to Array Logic", IBM Journal of Research and Development, Mar. 1975, pp. 98–109.

B. Kitson et al., "Programmable Logic Chip Rivals Gate Array in Flexibility", Electronic Design, Dec. 8, 1983, pp. 95–102.

"The World's Most Versatile Logic Tool; AmPAL22V10", Advanced Micro Devices, Inc., May 1984.

D. D. Hill et al., "Preliminary Description of Tabula Rasa,. an Electrically Reconfigurable Hardware Engine", Proceedings 1990 IEEE International Conference on Computer Design: VSLI in Computers and Processors, Sep. 17–19, 1990, pp. 391–395.

R. H. Freeman, "XC3000 Family of User–Programmable Gate Arrays", Microprocessors and Microsystems, vol. 13, No. 5, Jun. 1989, pp. 313–320.

*Primary Examiner*—David H. Malzahn
*Attorney, Agent, or Firm*—Fish & Neave; Robert R. Jackson

[57] ABSTRACT

Look up tables for use in programmable logic devices are modified to facilitate use of those tables to provide adders (including subtracters) and various types of counters. Each look up table is effectively partitioned into smaller look up tables when an adder or counter is required. One portion of the partitioned table is used to provide a sum out signal, while the other portion of the partitioned table is used to provide a fast carry out signal for application to the next stage of the adder or counter. If desired, each logic module including such a look up table may further include logic circuitry for logically combining its normal output with the signal applied to its carry in input to facilitate the provision of wide fan in functions having more inputs than can be accepted by a single logic module.

10 Claims, 4 Drawing Sheets

LOOK UP TABLE IMPLEMENTAION OF FAST CARRY ARITHMETIC AND EXCLUSIVE-OR OPERATIONS

This is a continuation-in-part of application Ser. No. 07/880,752, filed May 8, 1992, now U.S. Pat. No. 5,274,581.

BACKGROUND OF THE INVENTION

This invention relates to logic devices employing look up tables, and more particularly to improved ways of providing fast carry functions in such devices when the devices are to be used for such purposes as performing addition, subtraction, and counting.

Programmable logic devices are known in which programmable look up tables are used to perform relatively elementary logic functions (see, for example, Wahlstrom U.S. Pat. No. 3,473,160 (FIG. 8) and commonly assigned, co-pending U.S. patent application Ser. No. 754,017, filed Sep. 3, 1991, now U.S. Pat. No. 5,260,610). A look up table may provide as an output any desired logical function of several inputs. The outputs of several such look up tables may be combined (e.g., by other similar look up tables) in any desired way to perform much more complex logic functions.

Look up tables which are a good size for performing many elementary logic functions in programmable logic devices tend to be too large for performing the extremely simple functions required to provide two-input adders (including subtracters) and various kinds of counters. For example, four-input look up tables are a very good size for general use, but are larger than necessary for use in the individual binary places of adders and counters. Nevertheless, adders and counters are very often required in digital logic. It is therefore wasteful to use four-input look up tables for adders and counters. This is especially so when fast carry logic is used because for each binary place one four-input look up table is required to provide the sum out bit, and another four-input look table is required to provide the carry out bit. Neither of these look up tables is being fully utilized. Moreover, if large numbers of bit positions or places are required, the need to use two look up tables per bit position may exact a significant speed penalty because of the extensive use which must be made of the interconnect circuitry to interconnect the large number of look up tables involved.

In view of the foregoing, it is an object of this invention to provide improved ways of implementing adders (including subtracters) and counters in programmable logic devices made up of programmable look up tables.

It is a more particular object of this invention to provide programmable logic devices made up of look up tables in which adders and counters can be implemented more efficiently and with less waste of look up table resources.

It is still another more particular object of this invention to provide ways of achieving faster adders and counters in programmable logic devices made up of look up tables.

SUMMARY OF THE INVENTION

These and other objects of the invention are accomplished in accordance with the principles of the invention by adding to a look up table circuitry for allowing the look up table to be effectively partitioned into smaller look up tables, one of which performs sum out logic required for one bit position of addition, and the other of which performs carry out logic required for that same bit position. Additionally, logic may be added to selectively feed back the output of a flip-flop associated with each look up table to an input of that look up table to facilitate the use of the look up table as a counter stage. Still further logic may be added to facilitate loading and/or clearing of the flip-flop associated with each look up table to simplify the provision of loadable and/or clearable counters.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
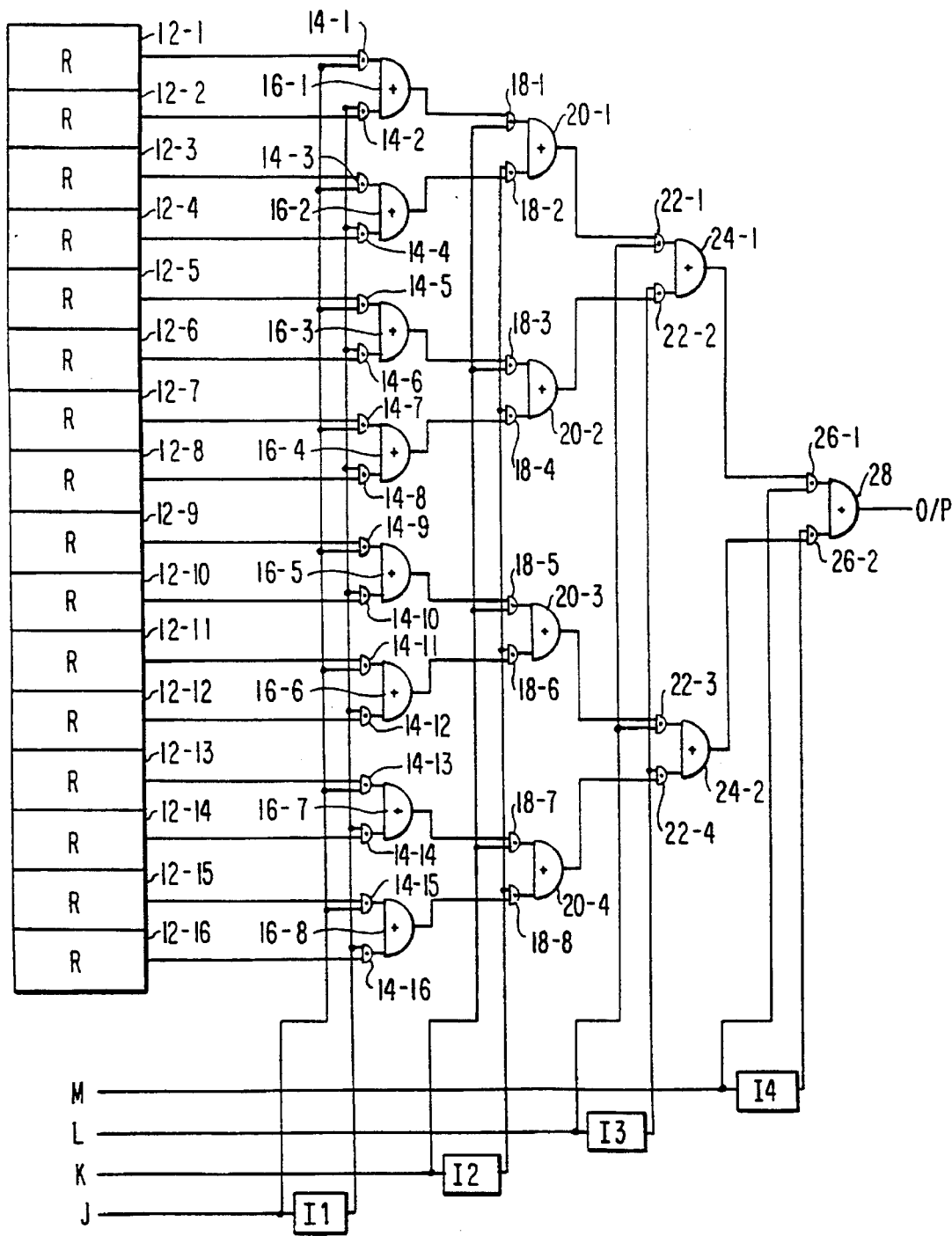
FIG. 1 is a schematic block diagram of illustrative prior art look up table apparatus.

FIG. 1 shows a conventional four-input look up table 10. Look up table 10 has 16 storage locations or function control elements ("FCE8s") 12-1 through 12-16, each of which stores one binary digit of information. Each FCE 12 may be a flip-flop (as in FIG. 8 of Wahlstrom U.S. Pat. No. 3,473, 160), a random access memory ("RAM") cell, or any other type of storage device such as an SRAM, a DRAM, a cell of a first-in first out ("FIFO") memory, an EPROM, an EEPROM, a ferro-electric memory cell, a fuse (e.g., a laser fuse), an anti-fuse, or the like. The contents of FCEs 12 may be fixed or programmable, and if programmable may be programmable only once or repeatedly. The logic connected to the outputs of FCEs 12 allows the four inputs J–M to select one and only one of the FCE outputs as the final output O/P of the look up table. The output of each FCE 12 is applied to one input of a respective one of AND gates 14-1 through 14-16. Input J is applied to the other input of AND gates 14-1, 14-3, 14-5, 14-7, 14-9, 14-11, 14-13, and 14-15, and, after inversion by inverter I1, to the other input of AND gates 14-2, 14-4, 14-6, 14-8, 14-10, 14-12, 14-14, and 14-16. Accordingly, half of AND gates 14 are enabled by input J, while the other half of these AND gates are not enabled. OR gates 16 pass the outputs of enabled AND gates 14 to the next level of AND gates 18.

Input K is applied to one input of AND gates 18-1, 18-3, 18-5, and 18-7, and, after inversion by inverter I2, to one input of AND gates 18-2, 18-4, 18-6, and 18-8. Accordingly, input K enables half of AND gates 18 and disables the other half of those AND gates. Input K therefore selects four of the eight FCE 12 outputs selected by input J. OR gates 20 pass the four FCE outputs selected by input K to the next level of AND gates 22.

Input L is applied to one input of AND gates 22-1 and 22-3, and, after inversion by inverter I3, to one input of AND gates 22-2 and 22-4. Input L therefore enables half of AND gates 22 and disables the other half of those AND gates. Accordingly, input L selects two of the four FCE 12 outputs selected by input K. OR gates 24 pass the two FCE outputs selected by input L to the next level of AND gates 26.

Input M is applied to one input of AND gate 26-1, and, after inversion by inverter I4, to one input of AND gate 26-2. Accordingly, input M makes a final selection of one of the two FCE 12 outputs selected by input L. OR gate 28 passes this finally selected FCE output to look up table output lead O/P.

It will be apparent from the foregoing that look up table 10 can provide any single logical function of its four inputs J–M. For example, if it is desired that the output of look up table 10 should be 1 when J and L are 0 and K and M are 1, then FCE 12-6 is programmed or otherwise set to store binary 1 so that this value will appear at output O/P when AND gates 14-6, 18-3, 22-2, and 26-1 are enabled.

Figure 2:
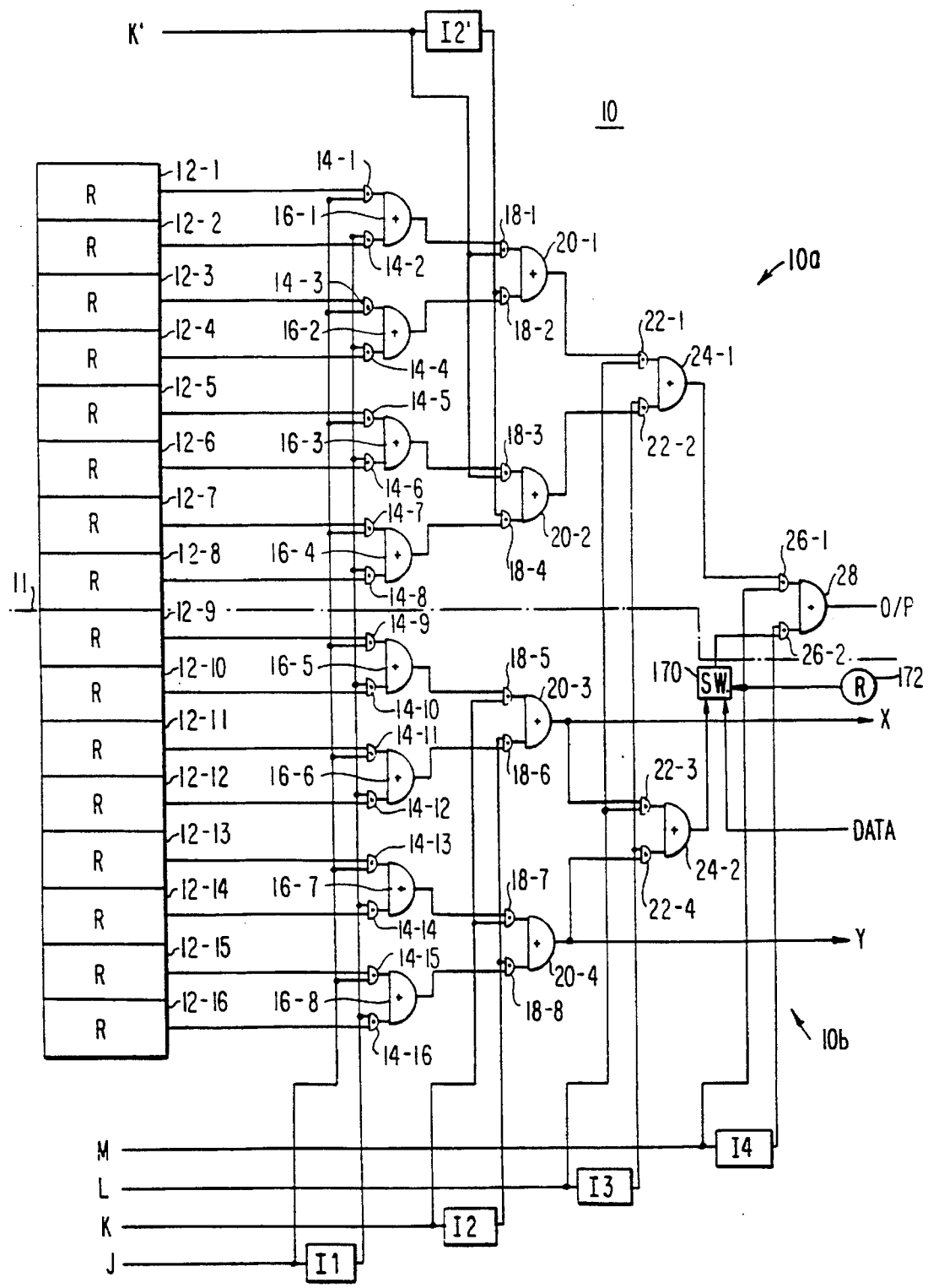
FIG. 2 is a schematic block diagram illustrating how the look up table of FIG. 1 can be modified in accordance with the principles of this invention.

If look up table 10 is to be used as one stage of a two-input adder (which term is used herein as a generic term for both adders and subtracters), it really has more capabilities than are needed to provide either the sum out or carry out value. Accordingly, look up table 10 is modified in accordance with this invention as shown in FIG. 2 so that it can provide both the sum out on normal output lead O/P and important precedents to the carry out value on leads X and Y. Prior art input K is split into two inputs K and K'. Input K continues to be applied in true or complement form to AND gates 18-5 through 18-8. Input K' is applied in true form to AND gates 18-1 and 18-3, and in complement form provided by inverter I2' to AND gates 18-2 and 18-4. An additional switch 170 is included between the output of OR gate 24-2 and the input of AND gate 26-2. Switch 170 is controlled by FCE 172 (which can be similar to any of FCEs 12) to apply either the output of OR gates 24-2 or the "data" input to AND gate 26-2. When look up table 10 is used as part of a loadable counter, the "data" input to switch 170 is used as the source of the data to be loaded into the counter.

Figure 3:
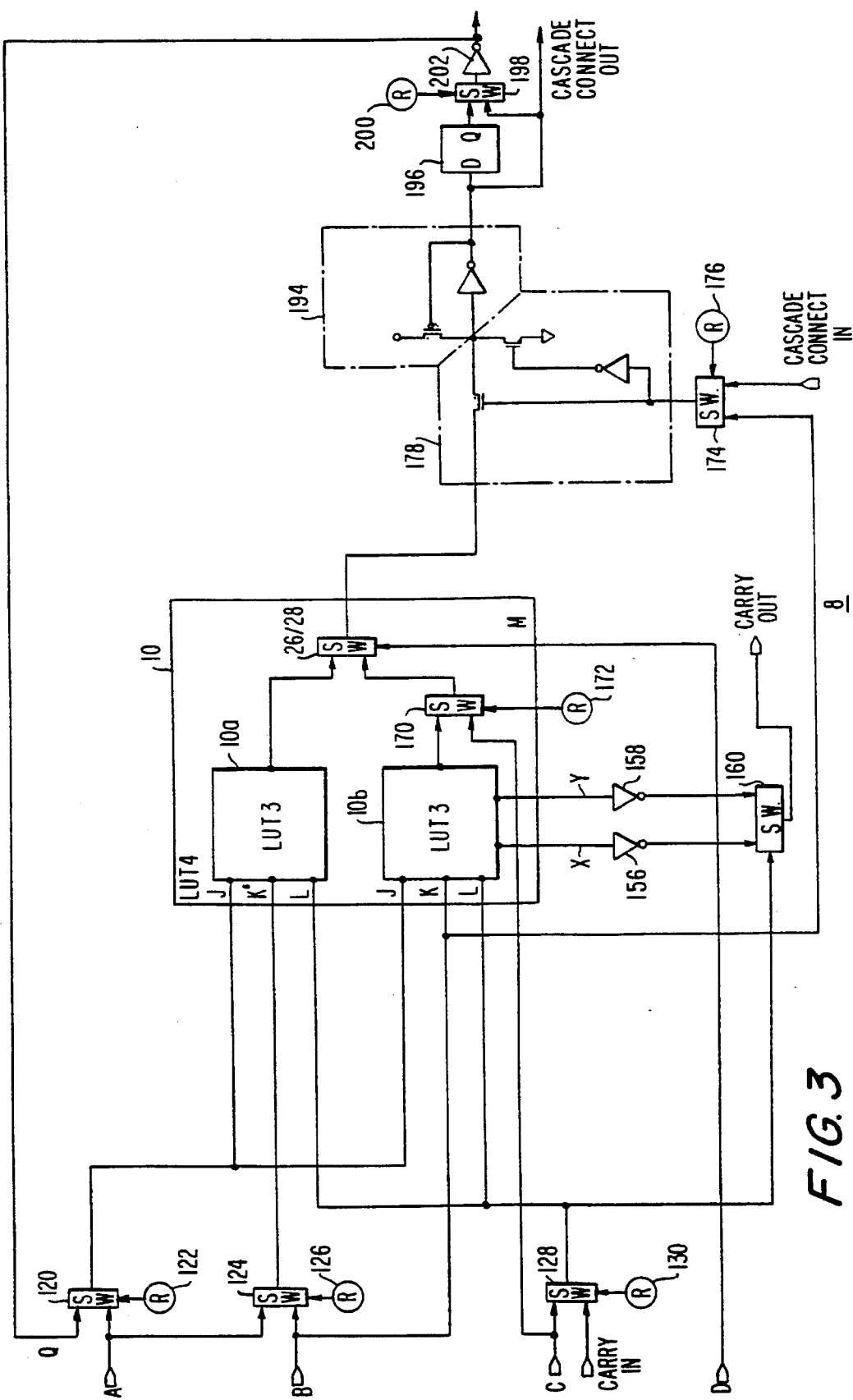
FIG. 3 is a schematic block diagram of illustrative apparatus constructed in accordance with this invention which uses the look up table apparatus of FIG. 2.

FIG. 3 shows how the modified look up table 10 of FIG. 2 can be used with other circuitry in accordance with this invention to provide an extremely flexible and powerful logic module 8 for use in programmable logic arrays (e.g., the logic arrays shown in commonly assigned, co-pending U.S. patent application Ser. No. 07/880,942, filed May 8, 1992, now U.S. Pat. No. 5,260,611). Logic module 8 has four regular data inputs A–D. It also has a carry in input, typically from the carry out output of another adjacent logic module which is used for the next less significant arithmetic place when logic module 8 is used for one place of binary addition, subtraction, or counting. The remaining input to logic module 8 is the cascade connect input, also typically from another adjacent logic module. As described in commonly assigned, co-pending U.S. patent application Ser. No. 07/880,888, filed May 8, 1992, now U.S. Pat. No. 5,258,668, the cascade connect input allows the cascade connect output signal of another logic module to be combined with the output of look up table 10 in logic module 8 if that is desired.

Logic module 8 has three outputs. These are its regular data output from output driver 202, the cascade connect output which bypasses elements 196 through 202, and the carry out signal. The cascade connect output signal of logic module 8 is applied to the cascade connect input of another, typically adjacent logic module. The carry out signal of logic module 8 is similarly applied to the carry in input of another, typically adjacent logic module which performs the next more significant place of binary addition, subtraction, or counting when any of those operations are performed.

When logic module 8 is used to perform normal logic rather than addition, subtraction, or counting, switch 120 is controlled by FCE 122 to apply the A input of the logic module to the J input of look up table 10, switch 124 is controlled by FCE 126 to apply the B input to the K' as well as the K inputs of table 10, and switch 128 is controlled by FCE 130 to apply the C input to the L input of table 10. (FCEs 122, 126, and 130 may be similar to any of the above-described FCEs.) The D input is applied at all times to the M input of table 10. Switch 170 is controlled by FCE 172 to apply the output of look up table portion 10b to switch 26/28, and switch 174 is controlled by FCE 176 to apply the cascade connect input to AND gate 178. (Again, FCEs 172 and 176 may be similar to any of the above-described FCEs.) As is discussed in above-mentioned application Ser. No. 07/880,888, the cascade connect input may be tied to logic 1 by other elements not shown herein if the cascade connect feature is not being used. As a result of the foregoing, look up table 10 in FIG. 3 operates just like the prior art look up table 10 in FIG. 1 and can produce any logical function of inputs A–D. The output signal of look up table 10 is applied to AND gate 178. After inversion and level adjustment by circuit 194, the output signal of AND gate 178 is applied to the main data output terminal of logic module 8 either directly or via flip-flop 196 as determined by switch 198 which is controlled by FCE 200 (similar to any of the above-described FCEs). The output signal of circuit 194 is also applied to the cascade connect output terminal of the logic module.

When it is desired to use logic module 8 to perform one place of binary addition, the two digits to be added are applied to the A and B inputs. The carry from the next less significant place of the addition operation (preferably performed by another logic module similar to logic module 8) is applied to the carry in input. (Above-mentioned application Ser. No. 07/880,942, which is hereby incorporated by reference herein, shows how multiple logic modules can be connected to one another in a carry chain when operations such as addition, subtraction, and counting are to be performed.) Switches 120, 124, and 174 are set as described above for normal logic, but switch 128 is set to apply the carry in input to the L input of table 10, and also to the control input of switch 160. The setting of switch 170 is of no consequence. The cascade connect input is tied to logic 1. Input D is used to control switch 26/28 to apply the output of look up table portion 10a to AND gate 178. The FCEs 12 of look up table portion 10a (generally the portion above chain dotted line 11 in FIG. 2) are programmed to apply the sum of A, B, and carry in to switch 26/28. This sum out signal passes through elements 26/28, 178, 194, etc., to the main output terminal of the logic module. The FCEs 12 of look up table portion 10b (generally the portion below chain dotted line 11 in FIG. 2) are programmed to provide the NOR and NAND of A and B on leads X and Y. These signals are inverted by inverters 156 and 158, and switch 160 selects the appropriate one for use as the carry out signal based on the carry in signal which controls that switch. The carry out signal of this logic module is the carry in signal of another similar logic module which performs the next more significant place of the arithmetic operation. (See again above-mentioned application Ser. No. 07/880,942 which shows how the carry out signal of each logic module is connected as the carry in signal of the arithmetically next more significant logic module.) Accordingly, with the modifications described above, a single logic module 8 can provide both the sum out and carry out signals for one place of binary addition.

Another capability of logic module 8 in accordance with this invention is to provide one stage of a binary up/down counter which can also be loaded to any value. This counter stage operates by adding the Q output of flip-flop 196 and the carry in input from the logic module providing the next less significant counting stage. Accordingly, switches 198 and 120 are set to apply the Q output to look up table input J, switch 124 is set to apply the A input to look up table input K', and switch 128 is set to apply the carry in input to look up table input L. Input B continues to be applied to look up table input K, input C continues to be applied to switch 170, and input D continues to be applied to look up table input M to control switch 26/28. Switch 170 is programmed to pass the applied C input to switch 26/28. Switch 174 is set to apply the cascade connect input to one input of AND gate 178. The cascade connect input signal is tied to logic 1 as described above. The FCEs 12 of look up table portion 10a are programmed so that the A input can selectively enable counting. The FCEs 12 of look up table portion 10b are programmed so that the B input can control whether the counter counts up or down. The up/down counter can be loaded with data from input C by using input D to momentarily cause switch 26/28 to apply the output of switch 170 to AND gate 178. Flip-flop 196 stores the output of AND gate 178 synchronously or asynchronously, depending on how the flip-flop is configured and what control signals are applied to it.

Still another capability of logic module 8 in accordance with this invention is to provide one stage of a clearable binary counter which can also be loaded to any value. This type of counter also counts by adding its Q output to the carry in input from the counter stage of next lower numerical significance. Unlike the above-described up/down counter, however, the clearable counter can only count up. To provide the clearable counter, switches 120, 124, 128, 170, and 198 are all set as described above for the up/down counter. Switch 174 is set to apply the B input to AND gate 178. The FCEs 12 of look up table portion 10a are programmed so that input A can selectively enable the counting action. Input B must also be logic 1 for the counter to count or hold its count. When it is desired to clear the counter, input B is switched to logic 0 which applies to 0 to the D input of flip-flop 196. Again, this clears flip-flop 196 either synchronously or asynchronously, depending on how the flip-flop is configured and what control signals are applied to it. The counter can be loaded with any desired value from the C input in the same way that the up/down counter can be loaded.

Figure 4:
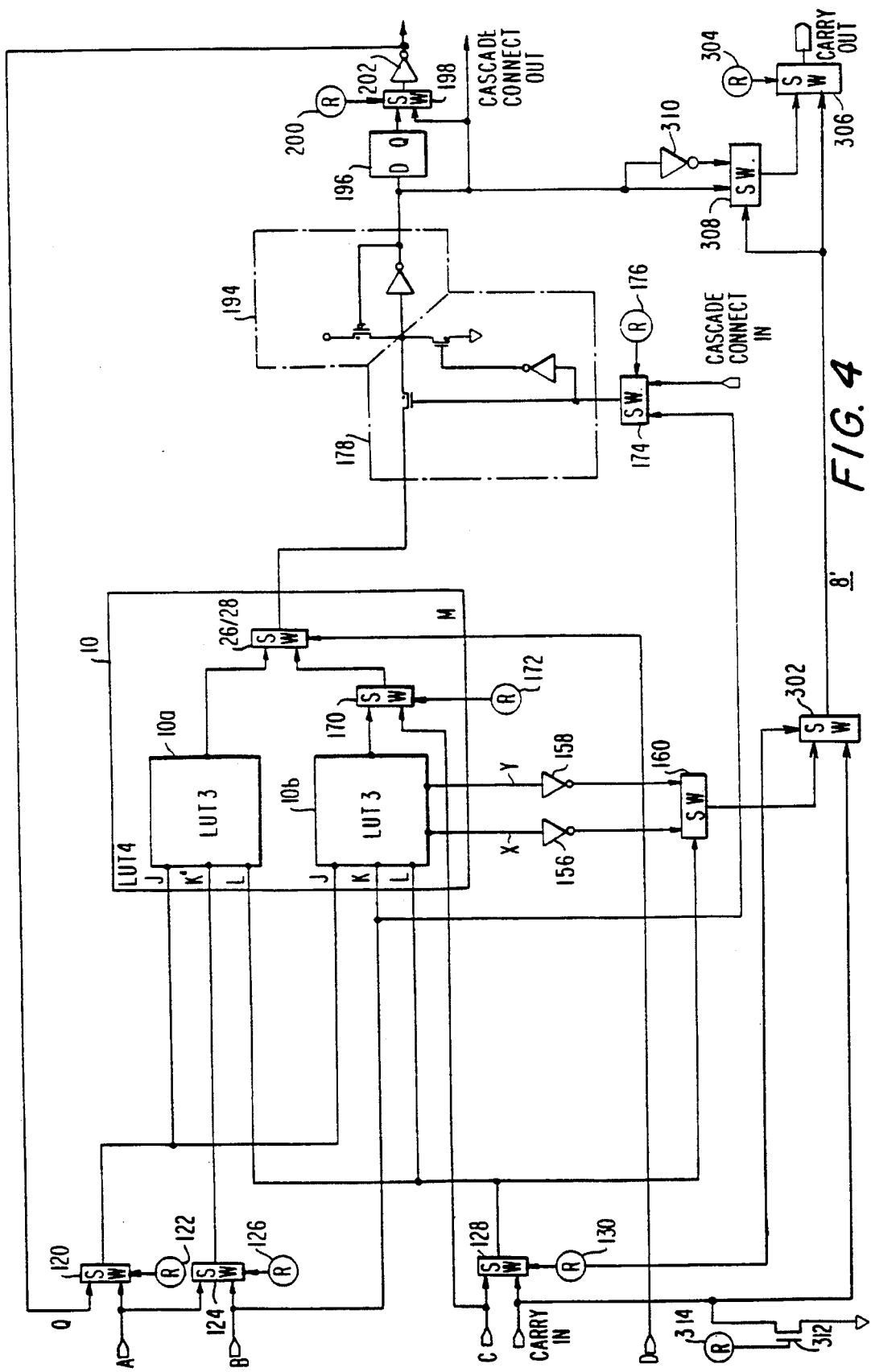
FIG. 4 is a schematic block diagram similar to FIG. 3 but showing additional circuitry which can be included in accordance with this invention to provide an alternative use for the carry interconnections between logic modules if desired.

FIG. 4 shows another embodiment of the invention which permits the carry in and carry out signals to transmit logic signals other than a carry digit between logic modules if desired. In the particular embodiment shown in FIG. 4, for example, the logic added to logic module 8' (as compared to logic module 8 in FIG. 3) permits logic module 8' to produce on its carry out lead the EXCLUSIVE OR of the signal on its carry in lead (from another logic module) and the normal output signal of look up table 10 (i.e., the output signal of switch 26/28). To make this possible the carry in signal is applied to one input terminal of switch 302. (Transistor 312 and FCE 314 allow the carry in signal to be tied off under certain special conditions described below.) The output signal of switch 160 is applied to the other input terminal of switch 302. The "position" or state of switch 302 is controlled by previously described FCE 130 so that when FCE 130 is programmed to cause switch 128 to select the carry in signal, FCE 130 also causes switch 302 to select the output of switch 160. FCE 304 will then also typically be programmed to control switch 306 to select the output of switch 302 so that the normal carry out signal from switch 160 is applied to the carry out lead as in previously described logic module 8. On the other hand, when FCE 130 is programmed not to cause switch 128 to select the carry in signal, then FCE causes switch 302 to select the carry in signal. This is the mode that allows the logic added to logic module 8' to provide the EXCLUSIVE OR of the carry in signal and the normal output signal of look up table 10 as will now be described.

In addition to being applied to one input terminal of switch 306, the output signal of switch 302 is applied to the control input terminal of switch 308. The signals applied to the two data input terminals of switch 308 are, respectively, the true and complement of the normal output signal of look up table 10. Inverter 310 provides the necessary logical inversion of the signal applied to one data input terminal of switch 308. When switch 302 passes the carry in signal and the carry in signal is logic 0, switch 308 selects the true of the normal output signal of look up table 10. On the other hand, when switch 302 passes the carry in signal and the carry in signal is logic 1, switch 308 selects the complement of the normal output signal of look up table 10. The output signal of switch 308 is therefore the EXCLUSIVE OR of the carry in signal and the normal output signal of look up table 10. When this feature of logic module 8' is used, FCE 304 is programmed to control switch 306 to pass the output signal of switch 308 to the carry out lead of the logic module.

The above-described feature of logic module 8' can be used to facilitate the provision of such logic functions as a wide fan in EXCLUSIVE OR. For example, if the look up table 10 in the similar logic module which provides the carry in signal to depicted logic module 8' is programmed to provide the EXCLUSIVE OR of its four inputs A–D and to direct the resulting output to its carry out lead, and if the look up table 10 in depicted logic module 8' is also programmed to provide the EXCLUSIVE OR of its four inputs A–D, then an extended EXCLUSIVE OR function can be provided by the two logic modules together. In the first of the above-mentioned logic modules the output of look up table 10 is directed to the carry out lead of that logic module by programming FCE 314 in that logic module to control associated transistor 312 to tie the associated carry in signal to ground (logic 0). This causes switch 308 in that logic module to apply the true of the normal output signal of associated look up table 10 to the associated carry out lead. More than two logic modules may be connected in such a chain. Logic functions other than EXCLUSIVE OR may be provided if desired. All of the capabilities described above in connection with FIGS. 1–3 are still available with the alternative embodiment shown in FIG. 4.

It will be understood that the foregoing is merely illustrative of the principles of this invention, and that various modifications can be made by those skilled in the art without departing from the scope and spirit of the invention. For example, there are many other ways in which the apparatus of this invention can be configured and/or programmed to perform the functions described above. As one illustration of this, X and Y could be the NOR and NAND of one of inputs A and B and the carry in input, with the other one of inputs A and B being used to control switch 160.

The invention claimed is:

1. Programmable logic array apparatus comprising:
a plurality of logic modules, each of which has a plurality of inputs and an output, and each of which is programmable to provide to said output an output signal, and each logic module having means to store an individual program for programming said module, the output signal being any of a plurality of logical functions of said inputs, a first of said logic modules including means for selectively receiving the output signal of a second of said logic modules, wherein a first of said plurality of inputs of said first of said logic modules provides an output signal of said second of said logic modules to said means for selectively receiving, and wherein said first logic module is programmable to provide a modified output signal to said output of said first logic module, said modified output signal being an EXCLUSIVE OR function of the unmodified output signal of said first logic module and said output signal of said second logic module.

2. The apparatus defined in claim 1 wherein each of said logic modules includes means for outputting an arithmetic carry signal distinct from said output signal, wherein each of said logic modules is programmed to perform a place of binary arithmetic on said inputs of each of said logic modules, said apparatus further comprising an interconnection between and distinct from said first and second logic modules, wherein said second logic module includes means for selectively applying either the arithmetic carry signal or the output signal of said second logic module to said interconnection, and wherein said first logic module includes means for applying the signal provided by said interconnection to said means for selectively receiving of said first logic module so that said means for selectively receiving of said first logic module can receive either said arithmetic carry signal or said output signal of said second logic module via said interconnection.

3. The apparatus defined in claim 2 further comprising a second interconnection between and distinct from said first logic module and a third of said logic modules, wherein said first logic module further includes means for selectively applying either said arithmetic carry signal or said output signal of said first logic module to said second interconnection for application to said third logic module via said second interconnection.

4. The apparatus defined in claim 3 further comprising a third interconnection between and distinct from said second logic module and a fourth of said logic modules, wherein said fourth logic module includes means for selectively applying the arithmetic carry signal of said fourth logic module to said third interconnection and wherein said means for selectively applying the output signal of said second logic module to said interconnection is responsive to the signal on said third interconnection and comprises means for selectively tying said third interconnection to a predetermined logical value.

5. The apparatus defined in claim 4 wherein said predetermined logical value is logic 0.

6. Programmable logic array apparatus comprising:

a plurality of logic modules, each of which has a means to store an individual program for programming said module, a plurality of inputs, a carry in input, a normal output, and a carry out output, each of said logic modules being programmable to provide to said normal output an output signal being any of a plurality of logical functions of said plurality of inputs and alternatively to perform a place of binary arithmetic on said plurality of inputs and carry in input and to produce as said output signal an arithmetic result signal for that place while also producing a carry out result signal for an adjacent place of said binary arithmetic on the carry out output; and an interconnection for conveying a signal from the carry out output of a first of said logic modules to the carry in input of a second of said logic modules, said first logic module including means for selectively applying the signal on said normal output of said first logic module to said carry out output of said first logic module, and said second logic module including means for selectively logically combining the signal provided by said interconnection on the carry in input of said second logic module and the signal on the normal output of said second logic module to produce a combined output signal.

7. The apparatus defined in claim 6 wherein said means for logically combining produces a combined output signal which is an EXCLUSIVE OR of the signal on the carry in input of said second logic module and the signal on the normal output of said second logic module.

8. The apparatus defined in claim 7 wherein said second logic module further includes means for selectively applying said combined output signal to the carry out output of said second logic module.

9. The apparatus defined in claim 6 wherein said means for selectively applying the signal on said normal output of said first logic module to the carry out output of said second logic module comprises means for selectively tying the carry in input of said first logic module to a predetermined logical value.

10. The apparatus defined in claim 9 wherein said predetermined logical value is logic 0.

* * * * *